(12) United States Patent
Connell et al.

(10) Patent No.: US 11,371,683 B1
(45) Date of Patent: Jun. 28, 2022

(54) LED LIGHT DRIVER

(71) Applicants: Jon Connell, Seattle, WA (US); Nathan Yang, Surrey (CA)

(72) Inventors: Jon Connell, Seattle, WA (US); Nathan Yang, Surrey (CA)

( * ) Notice: Subject to any disclaimer, the term of this patent is extended or adjusted under 35 U.S.C. 154(b) by 202 days.

(21) Appl. No.: 16/913,169

(22) Filed: Jun. 26, 2020

(51) Int. Cl.
| | |
|---|---|
| *F21V 23/04* | (2006.01) |
| *H05K 1/18* | (2006.01) |
| *F21V 23/00* | (2015.01) |
| *H05B 45/30* | (2020.01) |
| *F21V 29/89* | (2015.01) |
| *F21V 29/70* | (2015.01) |
| *H05K 1/02* | (2006.01) |
| *H05K 1/05* | (2006.01) |
| *F21Y 115/10* | (2016.01) |

(52) U.S. Cl.
CPC ............ *F21V 23/004* (2013.01); *F21V 29/70* (2015.01); *F21V 29/89* (2015.01); *H05B 45/30* (2020.01); *H05K 1/0203* (2013.01); *H05K 1/05* (2013.01); *H05K 1/183* (2013.01); *F21Y 2115/10* (2016.08); *H05K 2201/09036* (2013.01); *H05K 2201/1003* (2013.01); *H05K 2201/1006* (2013.01); *H05K 2201/10015* (2013.01)

(58) Field of Classification Search
CPC ...... F21V 23/003; F21V 23/004; F21V 29/70; F21V 29/89; H05K 1/05; H05K 1/18; H05K 1/183; H05K 1/021; H05B 45/30
See application file for complete search history.

(56) References Cited

U.S. PATENT DOCUMENTS

| | | | | |
|---|---|---|---|---|
| 7,545,021 | B1 * | 6/2009 | Sagen | ..................... H01F 27/40 257/E21.022 |
| 2008/0169768 | A1 * | 7/2008 | Yang | ........................ H05K 1/18 315/276 |
| 2018/0049314 | A1 * | 2/2018 | Amaducci | ........ G01R 31/31907 |

* cited by examiner

*Primary Examiner* — Thai Pham
(74) *Attorney, Agent, or Firm* — Gulf Coast Intellectual Property Group

(57) ABSTRACT

A LED light driver having a reduced overall thickness so as to facilitate placement within an octagon junction box and canopy. The LED light driver of the present invention includes a printed circuit board wherein the printed circuit board includes a first side and a second side and is planar in manner. The printed circuit board further includes a plurality of recesses formed on the first side and second side thereof so as to facilitate the reduction in the overall Z dimension of the LED light driver. The printed circuit board includes a metal base having an epoxy material utilized for insulation and an exterior case material. The metal base enclosed inside the epoxy further functions as a heat sink. The reduced height of the present invention further provides for less blockage of light and as such the LED light drive can be more proximate the light source.

11 Claims, 2 Drawing Sheets

LED LIGHT DRIVER

PRIORITY UNDER 35 U.S.C. SECTION 119(E) & 37 C.F.R. SECTION 1.78

This nonprovisional application claims priority based upon the following prior United States Provisional Patent Application entitled: LED Light Driver, Application No. 63/018,007 filed Apr. 30, 2020, in the name of Jon Connell, which is hereby incorporated by reference for all purposes.

FIELD OF THE INVENTION

The present invention relates generally to led lighting, more specifically but not by way of limitation, a led light driver that is configured to have a reduced Z dimension in order to provide the ability to facilitate the creation of a multitude of alternate designs of led lights, particularly in the residential lighting market.

BACKGROUND

As is known in the art, led light drivers are also referred to as led power supplies. LED light drivers are similar to ballasts for fluorescent lamps wherein the led light drivers provide the led lights the electricity needed to perform their desired function. LED lights require drivers for generally two reasons. First, led lights are designed to operate on low voltage, typically twelve to twenty four volts and further utilize direct current. Most electrical infrastructure provides an alternating electrical current at much higher voltage with the voltage being typically either 120V or 240V alternating current. The led light driver rectifies higher voltage, alternating current to low voltage, direct current. Additionally, led light drivers protect led lights from voltage or current fluctuations. A change in voltage can cause a change in current being supplied to the led lights. LED light output is proportional to its current supply and as such too much or too little current can cause light output to vary or degrade faster due to higher temperatures within the led light.

For residential lighting the most important element to facilitate the sale thereof is design. The design of a led light can result in the success or failure of the sale of a led light product. The led light drivers have a physical size wherein and are three dimensional wherein the three dimensions are the X, Y and Z dimension. The ability to control and/or impact the Z dimension provides the ability to create a multitude of led light designs wherein the led light driver does not have negative impact on the design of the led light.

It is intended within the scope of the present invention to provide a led light driver that is configured to have a reduced Z dimension so as to facilitate the ability to create numerous alternate designs for a led light.

SUMMARY OF THE INVENTION

It is the object of the present invention to provide a led light driver having a reduced thickness so as to be placed within a junction box and canopy wherein the present invention will utilize a printed circuit transformer.

Another object of the present invention is to provide a led light driver constructed to promote a reduced Z dimension in order to facilitate a multitude of alternate lighting designs wherein the present invention is configured to have a linear and compact design with modular circuit boards to provide a plurality of configurations.

A further object of the present invention is to provide a led light driver having a reduced thickness so as to be placed within a junction box and canopy wherein the present invention will utilize epoxy material as insulation and exterior case material.

Still another object of the present invention is to provide a led light driver constructed to promote a reduced Z dimension in order to facilitate a multitude of alternate lighting designs wherein the present invention includes a metal base enclosed inside an epoxy body functioning as a heat sink for the led light driver.

An additional object of the present invention is to provide a led light driver having a reduced thickness so as to be placed within a junction box and canopy wherein the aforementioned metal base further functions as a ground to compensate for impedance in current setting resistor circuit.

Yet a further object of the present invention is to provide a led light driver constructed to promote a reduced Z dimension in order to facilitate a multitude of alternate lighting designs wherein the present invention wherein the epoxy casing can further be configured to enclose an antenna.

Another object of the present invention is to provide a led light driver having a reduced thickness so as to be placed within a junction box and canopy wherein the present invention utilizes modular circuitry allowing components to be selected specifically for a unique light.

An alternate object of the present invention is to provide a led light driver constructed to promote a reduced Z dimension in order to facilitate a multitude of alternate lighting designs wherein the present invention is configured to accommodate alternate wireless components.

Still a further object of the present invention is to provide a led light driver having a reduced thickness so as to be placed within a junction box and canopy wherein the present invention utilizes a white exterior on outer epoxy to inhibit production of a dark spot on translucent sections of light fixtures.

An additional object of the present invention is to provide a led light driver constructed to promote a reduced Z dimension in order to facilitate a multitude of alternate lighting designs wherein the present invention utilizes an alternative shrink tube packaging to further reduce height of the led driver and increase thermal dissipation.

A further object of the present invention is to provide a led light driver having a reduced thickness so as to be placed within a junction box and canopy wherein the present invention provides versatility in case form factor.

To the accomplishment of the above and related objects the present invention may be embodied in the form illustrated in the accompanying drawings. Attention is called to the fact that the drawings are illustrative only. Variations are contemplated as being a part of the present invention, limited only by the scope of the claims.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
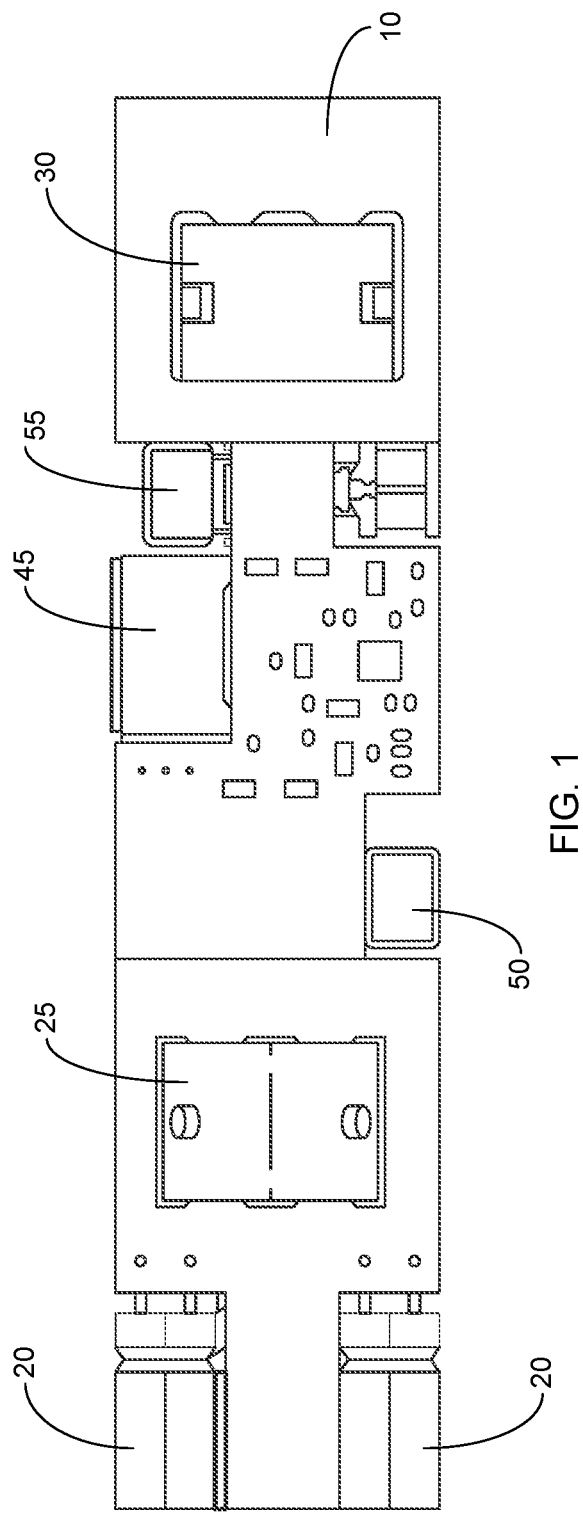
FIG. 1 is a top surface schematic view of the present invention.
Figure 2:
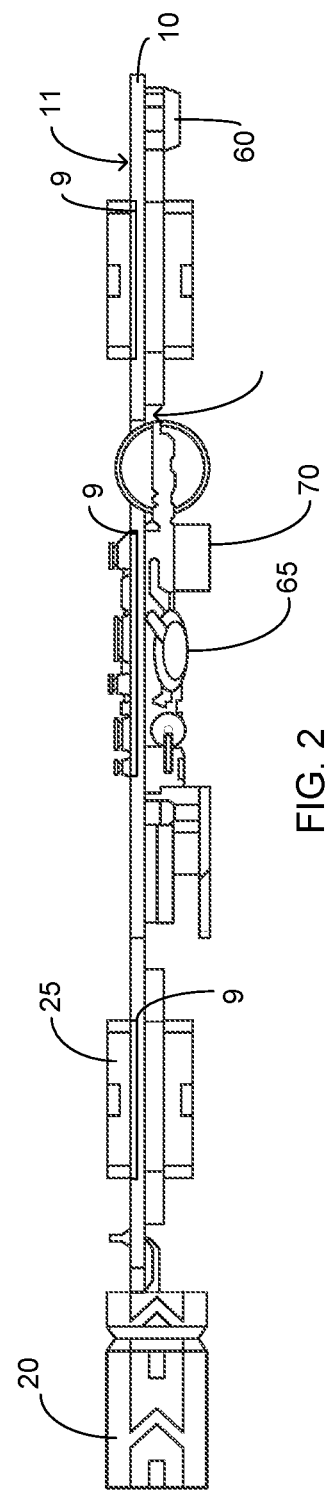
FIG. 2 is a side schematic view of the present invention.
Figure 3:
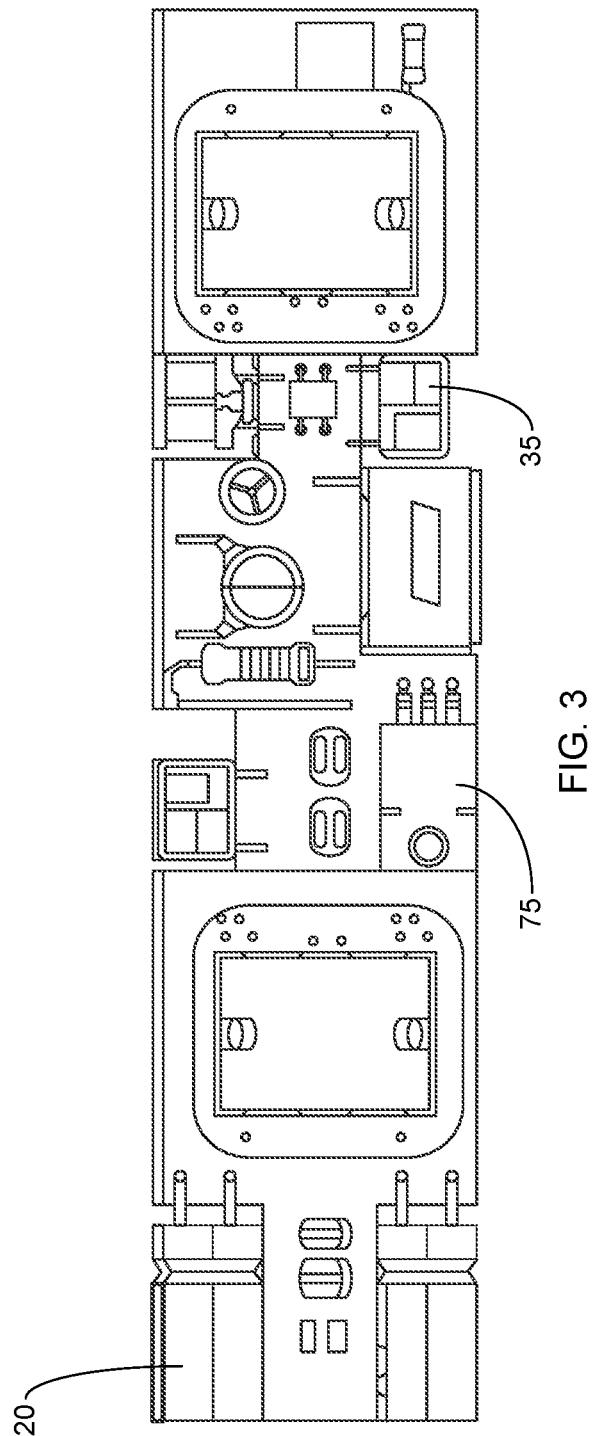
FIG. 3 is a bottom surface schematic view of the present invention.

Referring now to the drawings submitted herewith, wherein various elements depicted therein are not necessarily drawn to scale and wherein through the views and figures like elements are referenced with identical reference numerals, there is illustrated a LED light driver 100 constructed according to the principles of the present invention.

An embodiment of the present invention is discussed herein with reference to the figures submitted herewith. Those skilled in the art will understand that the detailed description herein with respect to these figures is for explanatory purposes and that it is contemplated within the scope of the present invention that alternative embodiments are plausible. By way of example but not by way of limitation, those having skill in the art in light of the present teachings of the present invention will recognize a plurality of alternate and suitable approaches dependent upon the needs of the particular application to implement the functionality of any given detail described herein, beyond that of the particular implementation choices in the embodiment described herein. Various modifications and embodiments are within the scope of the present invention.

It is to be further understood that the present invention is not limited to the particular methodology, materials, uses and applications described herein, as these may vary. Furthermore, it is also to be understood that the terminology used herein is used for the purpose of describing particular embodiments only, and is not intended to limit the scope of the present invention. It must be noted that as used herein and in the claims, the singular forms "a", "an" and "the" include the plural reference unless the context clearly dictates otherwise. Thus, for example, a reference to "an element" is a reference to one or more elements and includes equivalents thereof known to those skilled in the art. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

References to "one embodiment", "an embodiment", "exemplary embodiments", and the like may indicate that the embodiment(s) of the invention so described may include a particular feature, structure or characteristic, but not every embodiment necessarily includes the particular feature, structure or characteristic.

Referring in particular to the Figures submitted herewith, the LED light driver 100 is configured to provide a reduced Z dimension to facilitate a multitude of alternate lighting designs. The reduced Z dimension enables the present invention to be placed within the interior volume of an octagon junction box and canopy in order to broaden the alternate designs of the actual lighting fixture. The present invention reduces the Z dimension (height) of the LED light driver, the resulting lower profile enables the creation of more compact canopy and light fixture designs. It should be understood within the scope of the present invention that alternate embodiments such as a round embodiment or an alternate X dimensions are included within the scope of the present invention but all having the desired reduced Z dimension. While alternate Z dimensions are contemplated within the scope of the present invention, in a preferred embodiment the LED light driver 100 does not exceed a Z dimension of twelve millimeters.

The typical height of a UL listed thirty watt or lower LED light driver has a Z dimension between twenty and thirty millimeters. Placement of this conventional LED light driver within a typical code compliant lighting fixture would be to enclose the driver inside a canopy having a diameter equivalent to a standard junction box or place the assembly inside the light fixture housing. In the aforementioned the issue is that the canopy adds an additional ten millimeters of height (Z dimension) so as to accommodate wires and wire nuts. Furthermore, a LED driver that is installed within the light fixture is located close to the LED module and potentially will block light output. The present invention provides a reduced height (Z dimension) and as such lower profile and more compact canopies and fixture design becomes feasible.

The LED light driver 100 includes a printed circuit board 10 having a linear and compact design. The printed circuit board 10 includes a metal base enclosed inside epoxy casing so as to function as a heat sink for key components and reduce thermal stress. Further, the metal base functions as a ground to compensate for impedance in current setting resistor circuits. Utilizing epoxy potting for insulation and heat dissipation and further being molded around electrical components provides reduced of the height of the LED light driver 100. The printed circuit board 10 uses both the first side 11 and second side 12 to mount the components further described herein. The components are distributed across the printed circuit board 10 on the first side 11 and second side 12 in a manner that the components having the largest Z dimension determines the placement of additional components having the lowest Z dimension on the opposing side of the printed circuit board. Furthermore, the printed circuit board 10 includes recesses 9 formed therein for placement of the components therein so as to reduce the overall Z dimension.

The LED light driver 100 and the printed circuit board 10 includes a high ripple current output capacitor 20. The high ripple current output capacitor is a low impedance long life low ESR capacitor used to reduce losses and inhibit capacitor overheating. In a preferred embodiment the high ripple current output capacitor 20 has a diameter of ten millimeters wherein 6.4 millimeters extends outward from the first side 11 and 3.6 millimeters extends outward from the second side 12. The printed circuit board 10 further includes a transformer 25 and a filter 30. Both the transformer 25 and filter are planar having printed windings wherein the total height thereof is evenly distributed and does not exceed a height of 8.4 millimeters.

The printed circuit board 10 further includes an inductor 35 wherein the inductor has a ferrite drum core or is a planar wound power inductor that is no greater than 9.5 millimeters in diameter. A metallized polyester film capacitor 45 is present having a thickness of 5.2 millimeters. The film capacitor 45 is through hole mounted onto the printed circuit board 10. Suppression film capacitors 50,55 are mounted to the printed circuit board 10 using through hole mounting and have a thickness of 2.5 millimeters. The suppression film capacitors 50, 55 are class Y2 standard line bypass between line and ground. A bridge rectifier 60 is mounted proximate first end 8 of the printed circuit board 10. The bridge rectifier 60 has a height of 3.5 millimeters and is operably coupled to the second side 12 of the printed circuit board 10. The printed circuit board 10 further includes an AC safety capacitor 65 having a diameter of eight millimeters and further having a height of 4.7 millimeters. The AC safety capacitor 65 is through hole mounted to the printed circuit board 10.

The LED light driver 100 further includes a miniaturized dielectric capacitor 70. The miniaturized dielectric capacitor 70 is through hole mounted to the printed circuit board 10 to the second side 12 and further has a height of 6.4 millimeters. In a preferred embodiment, the miniaturized dielectric capacitor 70 is a long life radial leaded aluminum electrolytic capacitor. A MOSFET transistor 75 having a TO-220 profile is through hole mounted to the printed circuit board wherein the heat sink aligns with the miniaturized dielectric capacitor 70. This assists with heat dissipation and the preferred embodiment of the MOSFET transistor 75 is a high current high voltage capable model such as but not limited to a 650V 15 A. While not particularly illustrated herein it is contemplated within the scope of the present invention that the exterior of the LED light driver 100 is white so as to inhibit dark spot interference with a LED light.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical changes may be made without departing from the spirit or scope of the invention. The description may omit certain information known to those skilled in the art. The preceding description is, therefore, not intended to be limited to the specific forms set forth herein, but on the contrary, it is intended to cover such alternatives, modifications, and equivalents, as can be reasonably included within the spirit and scope of the invention.

What is claimed is:

1. A light emitting diode (LED) light driver having a reduced overall thickness to facilitate placement within an octagon junction box and canopy, wherein the LED light driver comprising:
    a printed circuit board, said printed circuit board being planar in manner, said printed circuit board having a first side and a second side, said printed circuit board having a plurality of recesses formed on said first side and said second side of said printed circuit board, wherein the printed circuit board includes a metal base enclosed within an epoxy body;
    at least one high ripple current output capacitor, said at least one high ripple current output capacitor being mounted into one of said plurality of recesses, said at least one high ripple current output capacitor configured to have 6.4 millimeters extend outward from the first side of said printed circuit board and 3.6 millimeters extends outward from the second side of the printed circuit board;
    a transformer, said transformed being planar in manner, said transformer having a height of 8.4 millimeters; and
    a filter, said filter being planar in manner, said filter having a height of 8.4 millimeters wherein the height of said filter is evenly distributed across the first side or second side of the printed circuit board.

2. The LED light driver as recited in claim 1, and further including an inductor, said inductor having a ferrite drum core, said inductor having a height of 8.5 millimeters.

3. The LED light driver as recited in claim 2, and further including a polyester film capacitor, said polyester film capacitor having a height of 11.1 millimeters.

4. The LED light driver as recited in claim 3, and further including a film capacitor, said film capacitor being mounted into one of said plurality of recesses formed on said printed circuit board, said film capacitor having a height of 7 millimeters.

5. The LED light driver as recited in claim 4, and further including a bridge rectifier, said bridge rectifier being mounted to said printed circuit board, said bridge rectifier being 3.5 millimeters in height.

6. The LED light driver as recited in claim 5, and further including at least one disc safety capacitor, said at least one disc safety capacitor being mounted to said printed circuit board and having a height of 4.7 millimeters.

7. The LED light driver as recited in claim 6, wherein the printed circuit board further includes a miniaturized dielectric capacitor mounted thereon, said miniaturized dielectric capacitor having a height of 6.4 millimeters.

8. The LED light driver as recited in claim 7, wherein the metal base of the printed circuit board is enclosed inside epoxy so as to function as a heat sink.

9. The LED light driver as recited in claim 8, wherein the LED driver provides a reduced Z dimension to facilitate the ability to create numerous alternate designs for a LED light, the reduced Z dimension is a reduced height of the LED light driver.

10. A light emitting diode (LED) light driver configured to provide a reduced Z dimension to facilitate the ability to create numerous alternate designs for a LED light, wherein the LED light driver comprises:
    a printed circuit board, said printed circuit board being planar in manner, said printed circuit board having a first side and a second side, said printed circuit board having a plurality of recesses formed on said first side and said second side of said printed circuit board, wherein the printed circuit board includes a metal base enclosed within an epoxy body;
    at least one high ripple current output capacitor, said at least one high ripple current output capacitor being mounted into one of said plurality of recesses, said at least one high ripple current output capacitor configured to have 6.4 millimeters extend outward from the first side of said printed circuit board and 3.6 millimeters extends outward from the second side of the printed circuit board;
    a transformer, said transformed being planar in manner, said transformer having a height of 8.4 millimeters;
    a filter, said filter being planar in manner, said filter having a height of 8.4 millimeters wherein the height of said filter is evenly distributed across the first side or second side of the printed circuit board;
    an inductor, said inductor having a ferrite drum core, said inductor having a height of 8.5 millimeters;
    a polyester film capacitor, said polyester film capacitor having a height of 11.1 millimeters;
    a film capacitor, said film capacitor being mounted into one of said plurality of recesses formed on said printed circuit board, said film capacitor having a height of 7 millimeters;
    a bridge rectifier, said bridge rectifier being mounted to said printed circuit board, said bridge rectifier being 3.5 millimeters in height;
    a miniaturized dielectric capacitor mounted thereon, said miniaturized dielectric capacitor having a height of 6.4 millimeters; and
    at least one disc safety capacitor, said at least one disc safety capacitor being mounted to said printed circuit board and having a height of 4.7 millimeters.

11. The LED light driver as recited in claim 10, wherein the metal base of the printed circuit board is enclosed inside epoxy so as to function as a heat sink.

* * * * *